(12) United States Patent
Poletto et al.

(10) Patent No.: US 10,523,189 B2
(45) Date of Patent: *Dec. 31, 2019

(54) RINGING PEAK DETECTOR MODULE FOR AN INDUCTIVE ELECTRIC LOAD DRIVER, RELATED SYSTEM AND INTEGRATED CIRCUIT

(71) Applicant: STMicroelectronics S.r.l., Agrate Brianza (IT)

(72) Inventors: Vanni Poletto, Casale Monferrato (IT); Andrea Maino, Novara (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/001,682

(22) Filed: Jun. 6, 2018

(65) Prior Publication Data

US 2018/0287597 A1 Oct. 4, 2018

Related U.S. Application Data

(63) Continuation of application No. 15/634,616, filed on Jun. 27, 2017, now Pat. No. 10,009,018.

(30) Foreign Application Priority Data

Dec. 1, 2016 (IT) .................. 102016000122087

(51) Int. Cl.
*H02P 6/06* (2006.01)
*H03K 5/1532* (2006.01)
(Continued)

(52) U.S. Cl.
CPC ............ *H03K 5/1532* (2013.01); *H02P 7/02* (2016.02); *H02P 7/025* (2016.02); *H02P 7/04* (2016.02); *H02P 27/085* (2013.01); *H03K 7/08* (2013.01); *H03K 17/165* (2013.01); *H03K 17/689* (2013.01)

(58) Field of Classification Search
CPC ...... H02P 7/04; H03K 5/1532; H03K 17/165; H03K 5/086
See application file for complete search history.

(56) References Cited

U.S. PATENT DOCUMENTS

7,583,224 B2 9/2009 Nakahama et al.
2015/0061750 A1 3/2015 Kandah et al.
(Continued)

*Primary Examiner* — Karen Masih
(74) *Attorney, Agent, or Firm* — Seed Intellectual Property Law Group LLP (57) ABSTRACT

A ringing peak detector circuit includes an input buffer receives a pair of differential feedback signals indicating a drain-source voltage of the at least one low side electronic switch. The input buffer generates shifted differential feedback signals having a common mode voltage that is equal to approximately one half of the supply voltage. A peak detector circuit is coupled to the input buffer to receive the shifted differential voltage signals. The peak detector circuit detects a peak value of an oscillation on the inductive electric load and to generate an output signal indicating the detected peak value. A circuit generates a control signal based on the detected peak value and a maximum value, with the control signal being applied to the inductive electrical load driver to control switching of the at least one low side switch.

26 Claims, 7 Drawing Sheets

(51) Int. Cl.
    *H02P 27/08*     (2006.01)
    *H03K 7/08*     (2006.01)
    *H03K 17/16*     (2006.01)
    *H03K 17/689*     (2006.01)
    *H02P 7/03*     (2016.01)
    *H02P 7/02*     (2016.01)
    *H02P 7/025*     (2016.01)

(56) References Cited

U.S. PATENT DOCUMENTS

2015/0349772 A1    12/2015  Schubert et al.
2016/0182016 A1    6/2016  Lukes et al.
2018/0146130 A1*    5/2018  Lee .......................... G03B 5/00

* cited by examiner

RINGING PEAK DETECTOR MODULE FOR AN INDUCTIVE ELECTRIC LOAD DRIVER, RELATED SYSTEM AND INTEGRATED CIRCUIT

BACKGROUND

Technical Field

Embodiments of the present disclosure relate to solutions concerning a ringing peak detector module for detecting a ringing at the output of an inductive electric load driver, in particular a DC motor driver, including a ringing peak detector circuit configured to detect a peak value of an oscillation taking in place on the inductive electric load, and a module configured to compare the detected peak value with a maximum value, and to command the driver by an error signal calculated as a function of the difference between the peak value and maximum value.

Description of the Related Art

In automotive applications the use of Direct Current (DC) or Brushless DC (BLDC) motors for fan, pump or actuator applications is very common with the trend of replacing the traditional DC with BLDC motors.

Inductive electrical loads such as DC motors, in particular brushless DC motors, are often controlled by means of pulse-width-modulation (PWM) in order to adjust an electric current and/or an electric voltage for the respective electrical load. For this purpose, an electrical load is often coupled in a resonant full-bridge or half-bridge circuit to electronic components such as metal-oxide semiconductor field-effect transistors (MOSFETs) or insulated-gate bipolar transistors (IGBTs) which are switched on and off under the control of the PWM signal and, as a result, adjust the current and/or the voltage for the electrical load.

A motor is often driven by means of one or more half-bridges as a function of one or more respective PWM signals.

Figure 1:
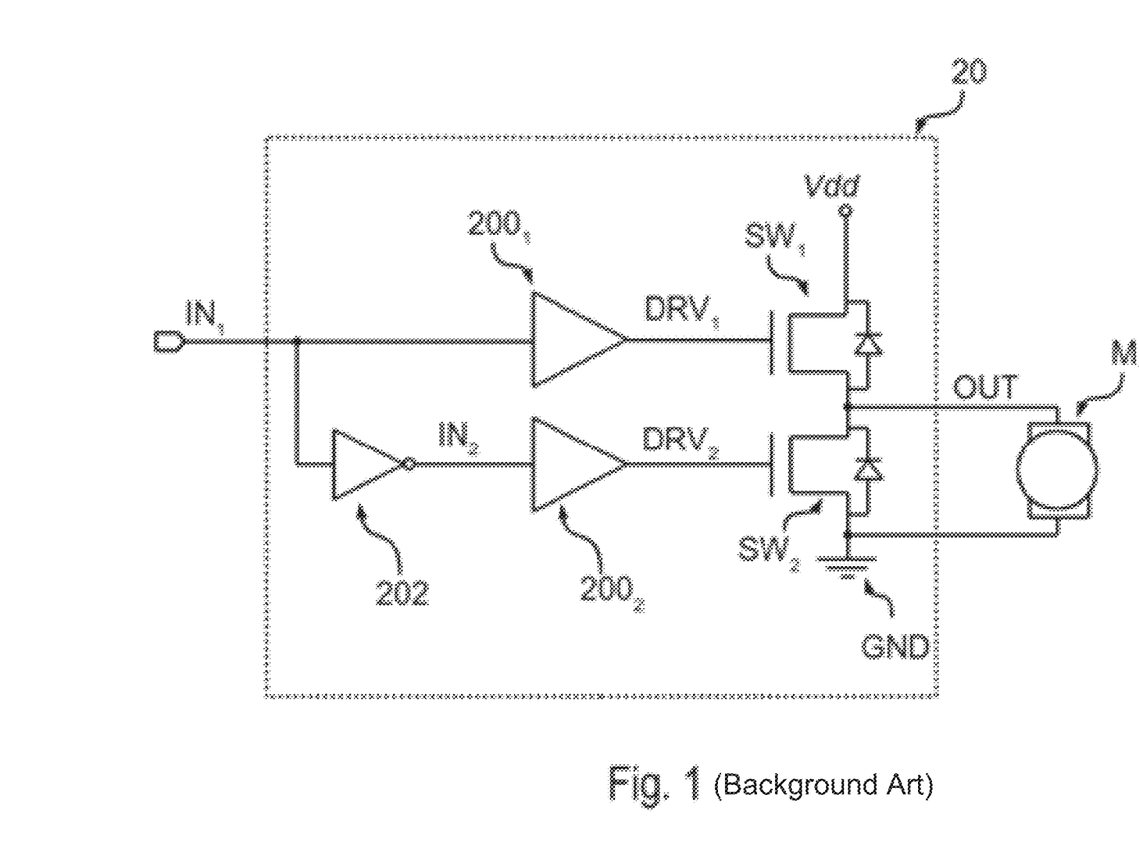
FIGS. 1 to 5 show embodiments of conventional drivers and ringing peak detector circuits.

For example, FIG. 1 shows a typical half-bridge circuit or arrangement 20 including two electronic switches $SW_1$ and $SW_2$, such as n-channel power MOSFETs (Metal-Oxide-Semiconductor Field-Effect Transistor), connected in series between a supply voltage Vdd and a ground GND.

Usually, the switches $SW_1$ and $SW_2$ are closed alternatively in order to connect the output OUT of the half-bridge arrangement 20, i.e., the intermediate point between the switches $SW_1$ and $SW_2$, either to the voltage Vdd or to ground GND.

For this purpose, the half-bridge arrangement 20 is driven as a function of two drive signals $DRV_1$ and $DRV_2$, which are connected (e.g., directly) to the control gates of the switches $SW_1$ and $SW_2$, respectively.

Specifically, in order to correctly drive the control gates, usually a high-side driver $200_1$ is used to generate the drive signal $DRV_1$ for the high-side switch $SW_1$ as a function of a first control signal $IN_1$, and a low-side driver $200_2$ is used to generate the drive signal $DRV_2$ for the low-side switch $SW_2$ as a function of a control signal $IN_2$.

The control signal $IN_2$ corresponds often to an inverted version of the signal $IN_1$ (or vice versa), i.e., the signal $IN_2$ is low when the signal $IN_1$ is high and vice versa. For example, in FIG. 1 an inverter 202 is used which receives at an input the signal $IN_1$ and provides at an output the signal $IN_2$.

The output OUT of the half-bridge arrangement 20 may be used to drive a load. For example, in FIG. 1, the half-bridge arrangement 20 drives a motor $M_1$ connected between the output OUT of the half-bridge arrangement 20 and ground GND.

Figure 2:
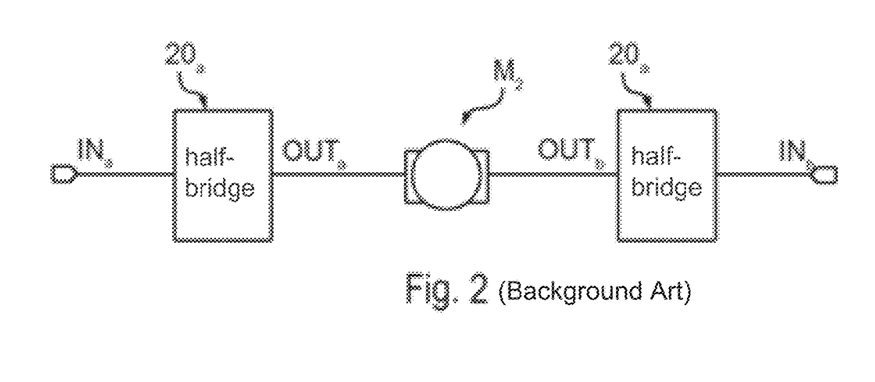

Conversely, FIG. 2 shows an example in which two half-bridge arrangements $20_a$ and $20_b$ are used to drive a linear motor $M_2$, such as a voice coil motor, connected between the output $OUT_a$ of the first bridge arrangement $20_a$ and the output $OUT_b$ of the second bridge arrangement $20_b$. As well known to those of skill in the art, in this case, also the rotation direction of the motor $M_2$ may be controlled by applying appropriate control signals $IN_a$ and $IN_b$ to the half-bridge arrangements $20_a$ and $20_b$.

Figure 3:
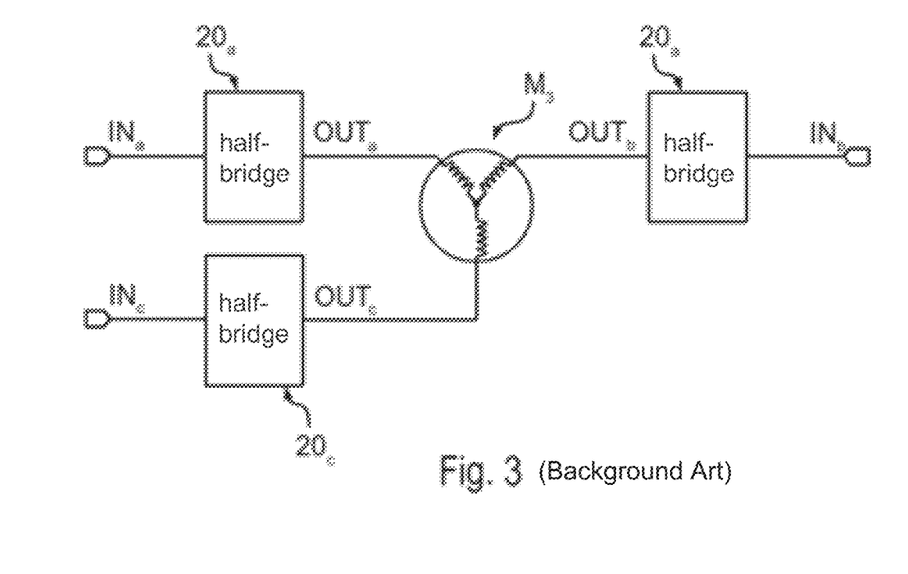

Finally, FIG. 3 shows an example in which three half-bridge arrangements $20_a$, $20_b$ and $20_c$ controlled by respective control signals $IN_a$, $IN_b$ and $IN_c$ are used to drive a three-phase motor $M_3$, such as a spindle motor, connected between the outputs $OUT_a$, $OUT_b$ and OUT, of the half-bridge arrangements $20_a$, $20_b$ and $20_c$.

As mentioned before, the control signals IN, or $IN_a$ and $IN_b$, or $IN_a$, $IN_b$ and $IN_c$ may be PWM signals, i.e., signals with a fixed frequency and a variable duty cycle.

When electronic components such as this are switched on and off, undesired parasitic oscillations of the current and the voltage, which can negatively affect the electromagnetic compatibility of the circuit and cause switching losses, can occur.

More in particular, there is the necessity to keep conducted emissions under a certain level, in a motor driver application. Conducted emission requirements are violated only in the frequency range where a ringing takes place. Ringing is an oscillation present at any terminal of an external MOS, caused by reverse recovery charge of the body diodes or by high di/dt or dv/dt.

In order to reduce parasitic oscillations, it is known to connect external capacitors to the gate and source or drain of the electronic components, gate resistors to reduce rates of change of the gate current and to use gate voltage or suppressor circuits for oscillation damping. Connection of such electrical components has several drawbacks, such as lengthening the switching times and increase the switching losses, switching delays and manufacturing costs.

Another known solution provides measuring the peak of the ringing at the output of the MOS transistor driving the motor or the electric load and subtracting from such peak a predefined set-point value, representing a maximum allowable ringing, in order to drive properly the gate of the external MOS, i.e., the electric component.

Figure 4:
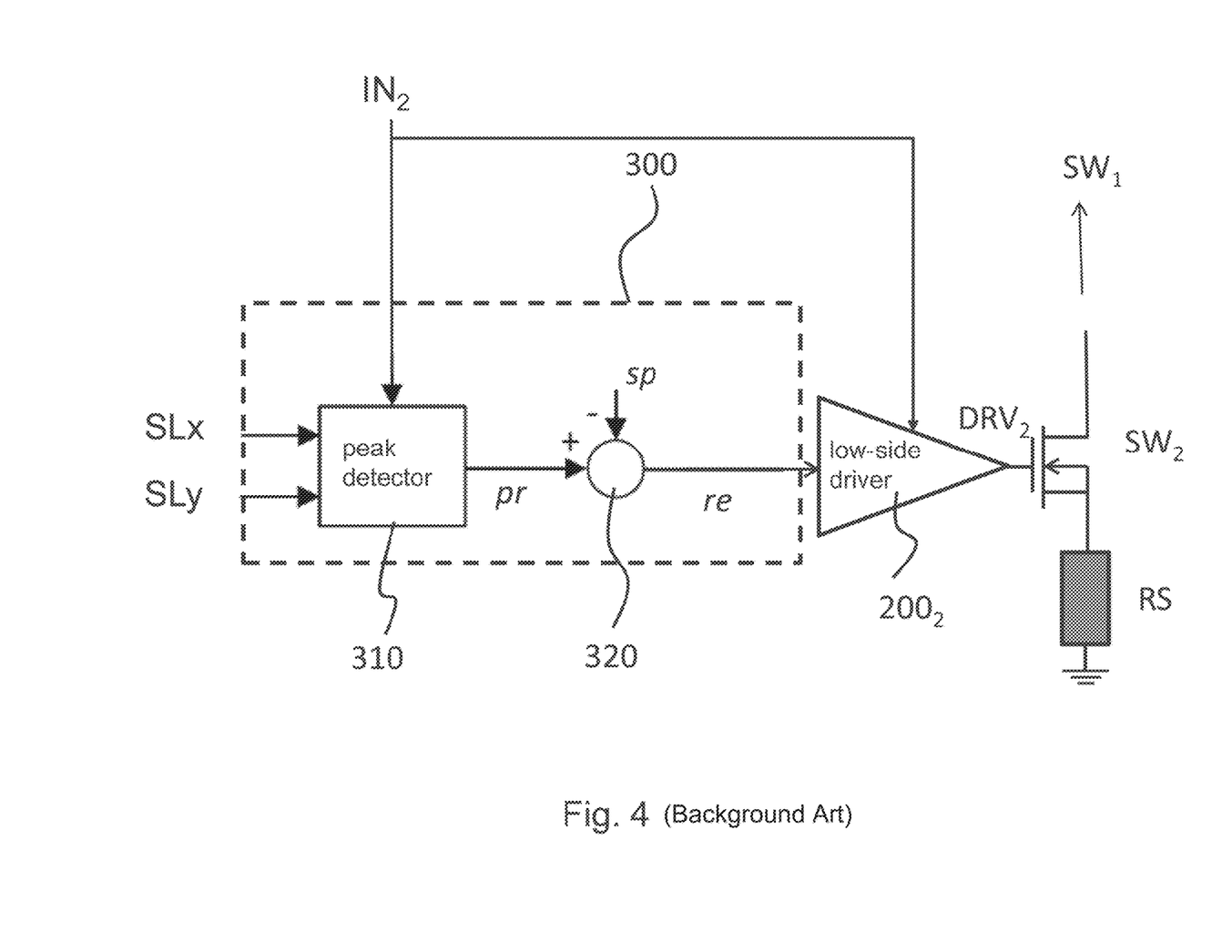

Such solution is schematized in FIG. 4, in which it is shown the low-side driver $200_2$ of FIG. 1 used to generate the drive signal $DRV_2$ for the low-side switch $SW_2$ as a function of a control signal, i.e., PWM signal, $IN_2$. In FIG. 4 it is also shown a shunt inductance RS connected between the source of the low-side switch $SW_2$ and the ground.

A ringing analyzer module 300 includes a peak detector circuit 310 which receives at an input the PWM control signal $IN_2$ and also receives a differential input. The differential input, SLx–Sly, obtained by a pair of feedback signals SLx and SLy, representative of the drain-source voltage of the low-side switch $SW_2$.

The peak detector circuit 310 outputs a peak value pv which, after the subtraction with a steady-state value ss, is brought as ringing peak pr to an input of a subtraction block 320 to perform the difference with a predefined setpoint sp, brought at the other input of the subtraction block 320, which represents the maximum allowable ringing. From the subtraction at block 320 a ringing error signal re is obtained, which is then sent to command the low-side driver $200_2$, which drives the gate of the low-side switch $SW_2$. The low side driver $200_2$ is configured to generate a pattern of gate current or a gate voltage in synchronism with the rising and falling edges of the PWM signal $IN_2$. The ringing error signal re can be used by the low side driver $200_2$ to command variations of such pattern of gate current or gate voltage so that the peak value pv is reduced.

For instance, in US 2015/0349772 A1, a method and device are described for switching an electronic component on or off under the control of a pulse-width-modulation signal which uses such a solution. The ringing error signal is used to vary switchover times to different levels of gate current or gate voltage to decrease the amplitude of the oscillations if their peak is greater than the setpoint sp.

Figure 5:
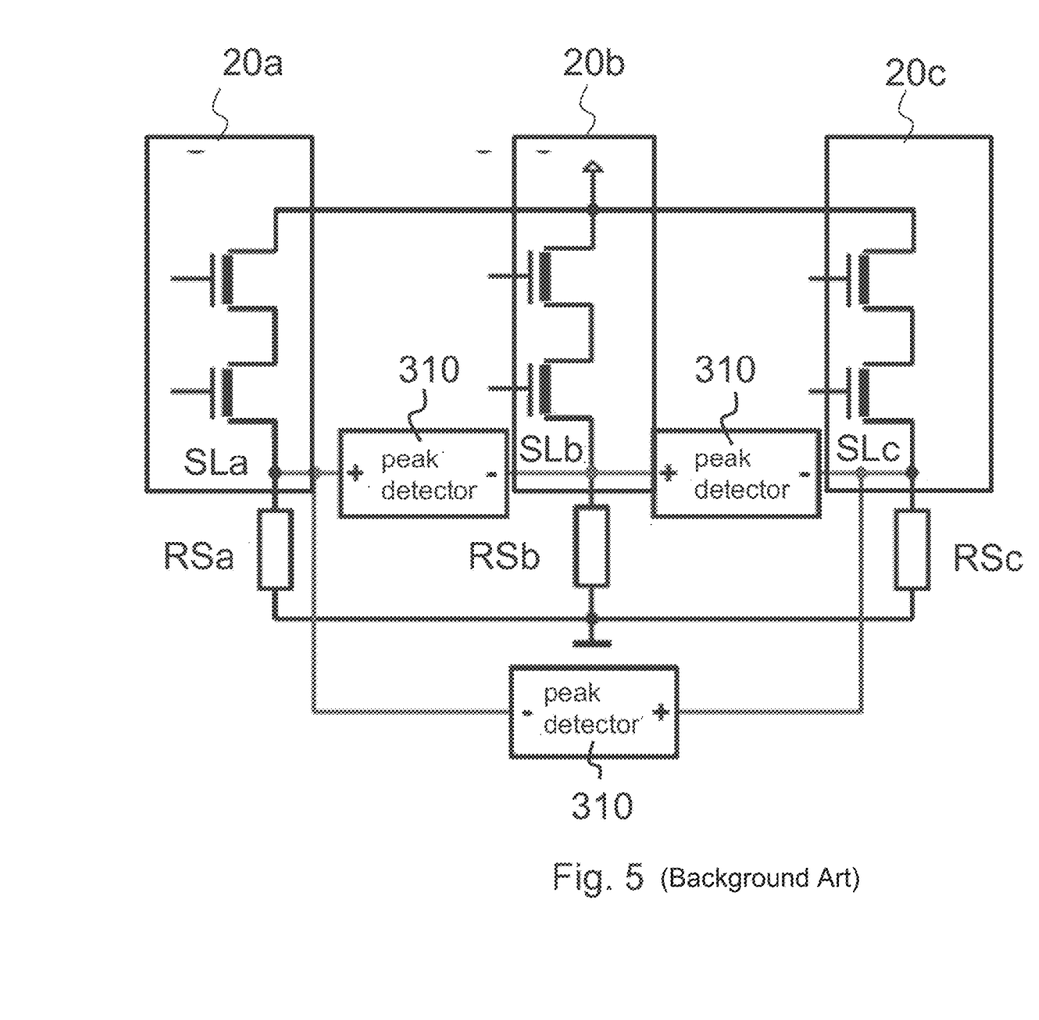

The differential input SLx–SLy is proportional to the drain source voltage of the low side switches, since each of the signals of the differential pair, SLx or Sly, is taken at the output of the low-side switch of the half-bridge of a given phase. In FIG. 5 is depicted an example with reference to a driver with three phases, like in FIG. 3, where there are therefore three peak detectors 310 connected between each one of the three-halfbridges 20a, 20b, 20c, one for each phase, receiving as differential input the difference of the pairs $SL_a$, $SL_b$, or $SL_b$, $SL_c$ or $SL_a$, $SL_c$, of signal taken on the respective shunt inductors RSa, RSb, RSc, connected between the source of the respective low side switch and ground.

The pair of signals $SL_x$ and $Sl_y$ of FIG. 4 can correspond to any of such three pairs, or to a difference of two signals, in the case of FIG. 2, or also one of the two signals can be zero, in the case of FIG. 1, i.e., the ringing analyzer 300 receives only one input, the other being zero.

This type of solution presents at least two inconveniences.

In the first place the input waveform at the peak detector, i.e., the waveform determined by the differential pair $SL_x$ and $Sl_y$, has a (functional) common mode between −1V and +1V (and an absolute between −6V and +6V), with a differential amplitude that can reach 3V. Therefore, the overall voltage range is outside the 3.3V CMOS Safe Operating Area (SOA). This can be solved using a high voltage switch at the input, with either 3.3V floating rails (to work with CMOS circuits) or use of cascodes, however it is difficult to guarantee precision and speed.

BRIEF SUMMARY

In view of the above, of the present disclosure provides solutions which overcome one or more of the above drawbacks.

Embodiments moreover concern a related method and integrated circuit.

As mentioned before, the present disclosure relates to a ringing peak detector module for detecting a ringing at the output of an inductive electric load driver, in particular a DC motor driver including a resonant full-bridge or half-bridge circuit including one or more high side electronic switches and one or more low side switches, in particular MOSFETs (Metal-Oxide-Semiconductor Field-Effect Transistor), connected in series between a supply voltage and a ground, a ringing peak detector circuit receiving a differential input obtained by a pair of feedback signals representative of the drain-source voltage of a low-side switch, configured to detect the peak value of an oscillation of the current and/or voltage taking in place on the inductive electric load, and a module configured to compare a ringing peak, corresponding to the difference between the detected peak value and the steady-state, with a predefined maximum value, commanding the inductive electric load driver by an error signal calculated as a function of the difference between the ringing peak value and maximum value. The ringing peak detector module includes an input buffer module, placed upstream the peak detector circuit, configured to shift the feedback signals of the differential input so that the common mode of the differential input is centered at a half-dynamic level, which is half of the supply voltage Vdd, providing as output for the input of a peak detector circuit a shifted differential output, which maintains a steady-state value of the differential input signal. The peak detection module includes an input buffer which includes input capacitors connected in series on each of its input pins receiving the pair of feedback signals forming the differential input, the capacitors being configured to sustain the input voltage range. An analog to digital differential module receives as an input one of the shifted voltage signals and the output signal of the peak detector, and supplies as an output their digital difference.

In various embodiments, the input buffer includes a shift module configured to connect the signals at its differential inputs to a half voltage corresponding to the half-dynamic level of the supply voltage.

In various embodiments, the input buffer includes a module configured to switch the polarity of differential signals at its differential inputs.

In various embodiments, the input buffer is connected to the input capacitors and the shift module is connected to the outputs of the input buffer.

In various embodiments, the peak detector circuit includes a differential amplifier receiving as input one of the shifted voltages and its output signals to control the charge of a peak capacitor to store the peak voltage.

In various embodiments, the steady-state voltage is subtracted from the detected peak value in order to obtain the ringing peak signal.

In various embodiments, the module is configured to compare the detected ringing peak with a maximum value, commanding the driver by an error signal calculated as a function of the difference between the ringing peak and maximum value includes a subtraction block configured to perform a subtraction between the detected peak value and with the predefined maximum value in order to obtain the error signal to command the gate of the low-side switch.

In various embodiments, the input buffer includes a set point circuit configured to add a voltage corresponding to the predefined maximum value to the differential output voltage of the input buffer.

In various embodiments, the set point circuit includes a set-point store capacitor connected at one end at the node on which the negative shifted voltage forms and the other is connected through a first switch to an input receiving the maximum value and through a second switch to ground, the set point circuit being configured to connect to the set-point store capacitor to the predefined maximum value to add a voltage corresponding to the predefined maximum value to the differential output voltage of the input buffer so that is equal to the sum of the steady-state voltage of the differential input and of the predefined maximum value.

The present disclosure relates also to a system including an inductive electric load driver, in particular a DC motor driver including a resonant full-bridge or half-bridge circuit including high side electronic switches and low side switches, in particular MOSFETs (Metal-Oxide-Semiconductor Field-Effect Transistor), connected in series between a supply voltage and a ground, and a peak detection module for detecting a ringing at the output of the inductive electric load driver as described above.

The present disclosure relates also to an integrated circuit including the peak detector module detection circuit or the system as described above.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

There is the need to store the peak value pv and the steady-state value ss of the input waveform in the peak detector, to calculate the ringing peak pr and subtract the set-point. A high frequency ringing (for instance 40-60 MHz), with a small amplitude (for instance ~50-100 mV) as compared to the total voltage swing of the entire input waveform can be critical as well as the polarity management, since the peak detector works only with rising signals. A possible solution could be the use of an internal capacitor and an adder operational amplifier to perform all the necessary math operations, however the architecture of the peak detector in this way becomes complex to be designed, since there is the need to store the steady-state value of the input, store the peak value of the input, compute the peak value minus steady-state to obtain the peak of the ringing, subtract then in the sum block following the peak detector the set-point to obtain the ringing error to drive the gate.

In the following FIGS. 6 and 7 parts, elements or components which have already been described with reference to FIGS. 1 to 5 are denoted by the same references previously used in such figures. The description of such previously described elements will not be repeated in the following in order not to overburden the present detailed description.

As mentioned in the foregoing, the present disclosure relates to a ringing peak detector module for detecting a ringing at the output of an inductive electric load driver, in particular a DC motor driver.

Figure 6:
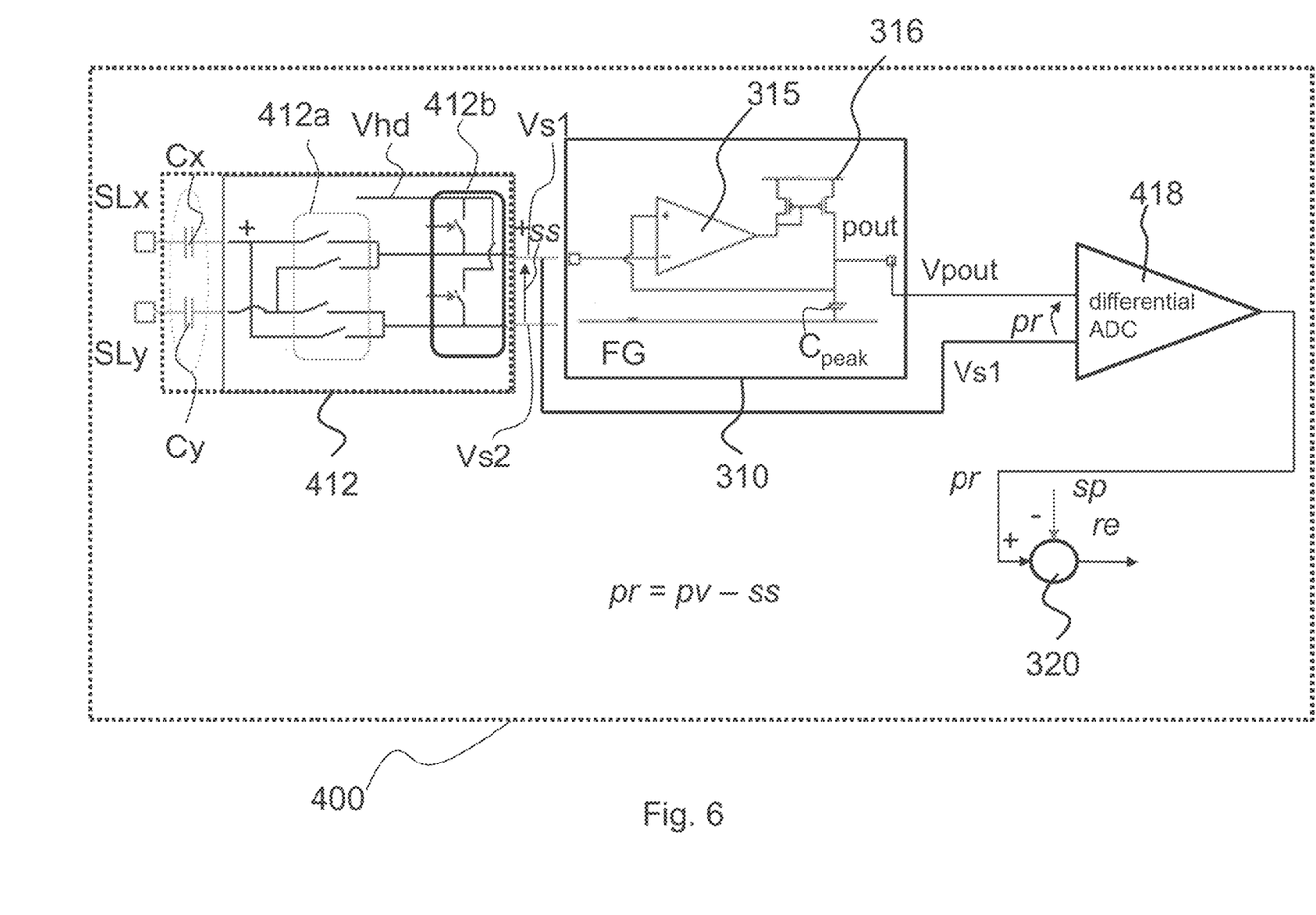
FIG. 6 shows an embodiment of a ringing peak detection module.

FIG. 6 shows the general architecture of a ringing peak detector module 400 in accordance with the present disclosure.

In the embodiment considered, the peak detector module 400 includes an input buffer module 412 to shift and possibly invert the differential input SLx–SLy, with a common mode of the differential input SLx–SLy centered at the half-dynamic level of the supply voltage, which in the example is 1.65V.

The input buffer module 412 includes input capacitors Cx, Cy connected in series on each of the input pins receiving the pair of feedback signals SLx, SLy forming the differential input SLx–Sly. In this case feedback signal SLx, which may for instance correspond to signal Sla in FIG. 3, is the signal at the positive input of the ringing peak detector module 400 (and, as shown in the following, of the peak detector circuit 310), while signal SLy, which may for instance correspond to signal SLb in FIG. 3, is the signal at the negative input. Such input capacitors Cx, Cy allow sustaining the input voltage range, so that it is possible to use a complete CMOS 3.3V architecture.

Then a module 412a to select the polarity of the input differential signals SLx, Sly is provided including an arrangement of switches configured to switch upon selection the connections of the feedback signals SLx and SLy to the inputs of a following module, specifically a following shift module 412b.

The shift module 412b is configured through a respective arrangement of switches to selectively connect the input differential signals SLx, Sly, according to the polarity selected in block 412a, to a half voltage Vhd corresponding to the half-dynamic level of the supply voltage, e.g., 1.65 V for 3.3V CMOS. This initialization is needed because the input buffer 412 is designed to follow the differential variations of the input signal, but is not able to set the DC starting point of the two signals related to GND.

The input buffer module 412 supplies a shifted differential output formed by a pair of voltage shifted signals, Vs1 and Vs2, where Vs1 indicates the shifted positive signal and Vs2 the shifted negative signal.

In summary, the input buffer module 412 is configured to supply a buffered differential output, Vs1–Vs2, corresponding to the steady state value ss of the differential input SLx–Sly.

The ringing peak detector module 400 then includes the peak detector circuit 310, which receives at its inputs the two signals of the differential output Vs1, Vs2 of the input buffer module 412, in place of the input differential signals SLx, SLy, and supplies an output voltage Vpout corresponding to the peak of the such buffered differential output Vs1–Vs2. In particular, the positive shifted signal Vs1 is brought to the inverting input of a differential amplifier 315 while the negative shifted signal Vs2 is brought to a floating ground line FG. The positive input of the differential amplifier 315 is connected to the output node Vout of the circuit 310. A current mirror 316 is connected to the CMOS voltage supply VCC (i.e., is connected between the output of the differential amplifier 315 and output node pout), the diode connected transistor of the current mirror 316 receiving the output current of the differential amplifier 315 and the output of the other transistor of the current mirror 316 generating the output voltage Vpout.

A peak capacitor $C_{peak}$, to store the peak voltage, is connected between the output node pout and the floating ground line FG.

The current mirror 316 charges the peak capacitor $C_{peak}$. When the output is lower than the input the amplifier 315 enables the current mirror 316 to charge the peak capacitor $C_{peak}$. When the output reaches the peak value, the amplifier 315 shuts off the current mirror 316 and the output is held at the peak value, i.e., peak voltage, on the peak capacitor $C_{peak}$.

The peak detector 310 is a circuit which is known to the person skilled in the art and the peak detector circuit of FIG. 6 can be substituted with other topologies of peak detector circuits performing corresponding functions.

Then an output voltage Vpout on the output node pout of the circuit 310 is brought to a differential analog to digital converter (ADC) 418, which receives at its inputs such output voltage Vpout and the positive shifted voltage Vs1.

The input buffer module 412 is able to keep the steady-state value ss of the differential input, i.e., the difference SLx–SLy, which is stored in the differential shifted output voltage (Vs1–Vs2).

The peak voltage is stored in the differential voltage Vpout–Vs2.

Therefore, the ringing peak pr, which is the difference between the peak voltage and the steady state ss of the input differential signal, is equal to (Vpout–Vs2)–(Vs1–Vs2)=(Vpout–Vs1)

Using the differential analog to digital converter 418, it is possible to convert directly the ringing peak signal, as the differential voltage between the output voltage Vpout and the shifted positive input Vs1, without any additional operation.

The output signal of the differential ADC 418, i.e., the detected ringing peak pr, can be then sent to the subtraction block 320 to perform a subtraction with the predefined set-point sp, which represents the maximum allowable ringing, in order to obtain a ringing error re to command the gate of the low-side switch $SW_2$.

Figure 7:
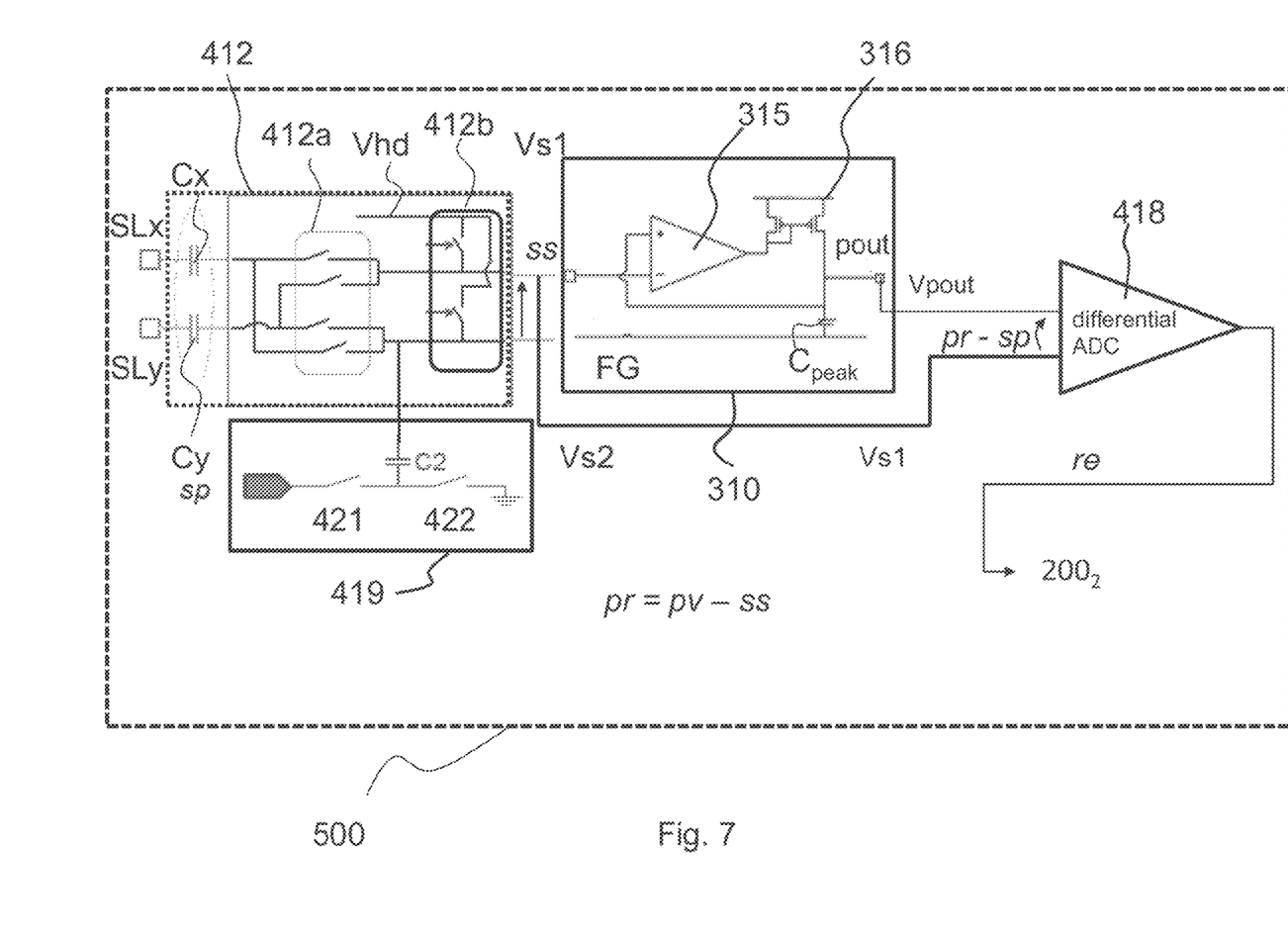
FIG. 7 shows a second embodiment of a ringing peak detection module.

In the variant embodiment shown in FIG. 7, a set point circuit 419 is added to the input buffer 412. Such set point circuit 419 includes a set-point store capacitor C2, which is connected at one end at the node on which the negative shifted voltage Vs2 forms and the other is connected through a first switch 421 to an input receiving the set-point sp and through a second switch 422 to ground.

Preferably, the capacitance value of the set-point store capacitor C2 is equal to the capacitance value of each of the input capacitors Cx, Cy.

The input buffer 412, as in FIG. 6, is able to keep at its output the steady-state value ss of the differential input SLx–SLy, stored in its differential output voltage Vs1–Vs2.

When the set-point store capacitor C2 is switched from the ground to the set-point sp by operating on the switches 421 and 422, thus it is created a differential event equal to the set-point sp for the input buffer 412, so that the differential output voltage Vs1–Vs2 of the input buffer 412 when the set-point store capacitor C2 is switched from the ground to the set-point sp is equal to the sum of the steady-state voltage ss and of the set point sp.

As already indicated, with reference to FIG. 6, at the input of the differential ADC 418, it is obtained a voltage equal to (Vpout–Vs2)–(Vs1–Vs2); as the difference between Vs1 and Vs2 is equal to the steady-state voltage ss summed to the set-point sp, then at the input of the differential ADC 418 it is obtained a voltage which corresponds to the peak voltage of the differential input signal SLx–Sly, minus the steady state of such input signal, SLx–SLy minus the set point sp. More briefly:

ADC input=peak voltage pv–(steady-state voltage ss+set-point sp)

therefore:

ADC input=peak voltage pv–steady-state voltage ss–set-point sp

Since however the ringing peak pr, i.e., the amplitude value of the oscillation, is equal to the difference between the peak voltage pv and the steady-state value ss of the differential input SLx–Sly:

(peak voltage pv–steady-state voltage ss)=ringing peak pr it turns out that at the input of the differential analog to digital converter 418 it is obtained the differential input:

pr–sp=re.

In this case therefore the ringing error re can be supplied directly to the gate driver $200_2$ without using the subtraction block 320.

In other words, the input buffer 412 is able to maintain the steady state value ss of the input differential signal, since it follows the variations, also very slow variations, of the differential input, in addition to shifting the common mode voltage to the half-dynamic level.

The peak value pv is the peak of the differential signal with respect to the differential zero voltage (Vpout–Vs2). The peak ringing pr is the difference between the peak value pv and the steady state value ss, which can be different from 0V. Peak ringing pr represents the peak of the oscillation that it is desired to reduce. This allows automatically computing the peak ringing pr by directly connecting the voltages Vpout and Vs1 to the analog to digital converter 418.

The solutions disclosed herein have thus significant advantages with respect to the known solutions.

The ringing peak detection module by the input buffer is able to maintain the regime value of the differential signal, since it follows the variations, also very slow variation, of the differential input, in addition to shift the common mode voltage to the half-dynamic level.

Figure 8:
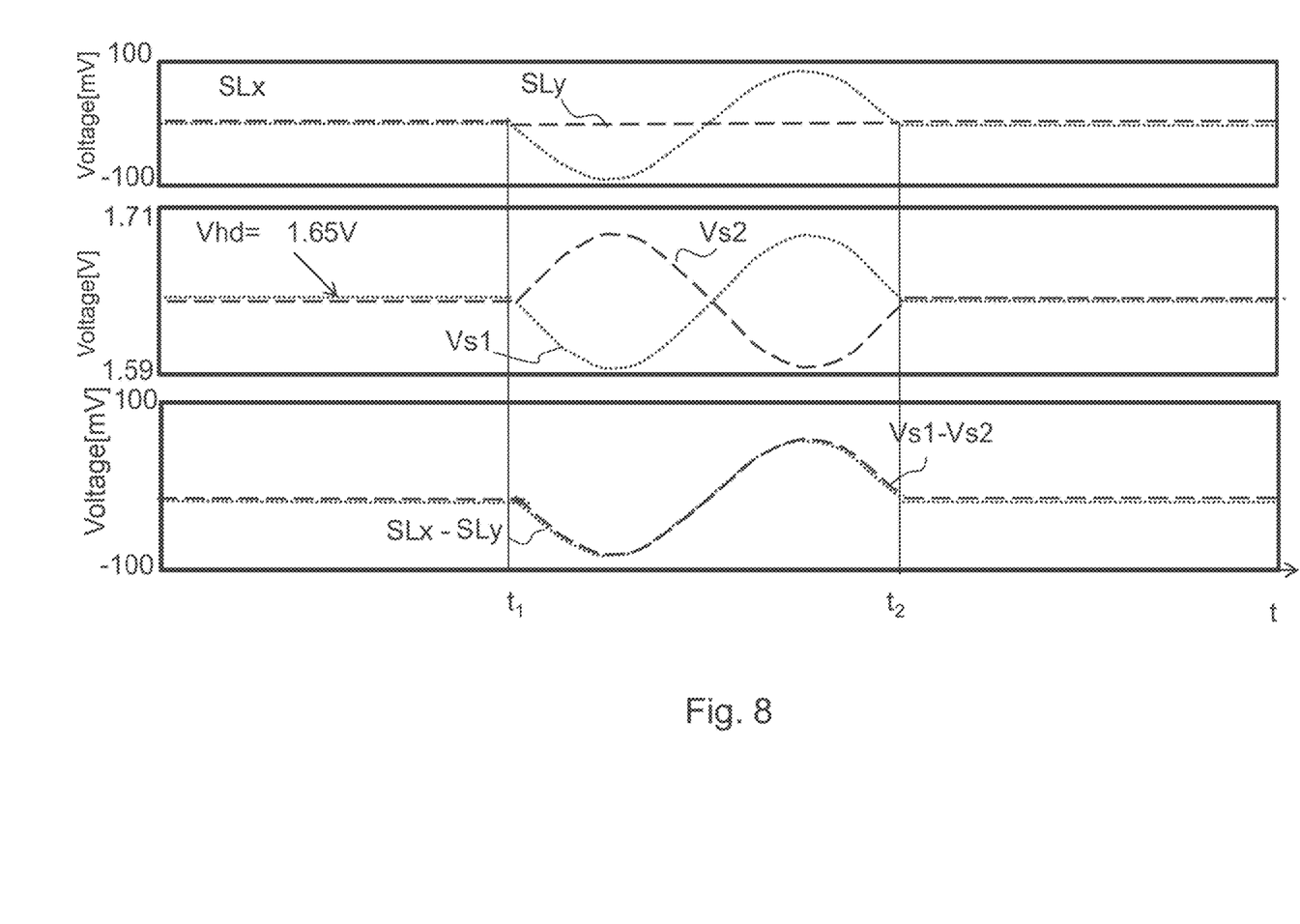
FIG. 8 shown a time diagram of quantities formed in the ringing peak detection module.

FIG. 8 shows a time diagram of quantities formed in the ringing peak detection module. In the upper diagram, the pair of feedback signals SLx (dotted line) and SLy (dashed line) are represented as a function of time. Between time $t_1$ and $t_2$ the feedback signal SLx presents a sinusoidal wave, i.e., a differential event, between –100 mV and 100 mv, while feedback signal SLy is zero and remains equal to zero, i.e., it is connected to the source of a non-switching MOS. The signal SLy is zero, since it is connected to a branch which does not switch. It has to be noted that the circuit described with reference to FIG. 5, to drive a three-phase motor, is based on the assumption that only one MOS at a time switches. In the example of FIG. 8 SLx is connected to the branch which is currently switching.

In the central diagram of FIG. 8 are shown the shifted voltage Vs1 (dotted line) and Vs2 (dashed line). As it can be seen, they have a steady state value at Vhd=1.65V, and, in the time interval $t_1$–$t_2$ corresponding to the differential event they take opposite values with peak to peak amplitude of 100 mV.

In the lower diagram of FIG. 8 are shown the differential input SLx–SLy (dotted line) and the differential output voltage Vs1–Vs2 (dashed line), which, in the time interval $t_1$-$t_2$ corresponding to the differential event maintain substantially the same values.

The solution here disclosed allows architecture simplification and use of a standard CMOS structure to design the core block.

Further there is no o need of floating rails to manage a high input swing (common mode).

On the whole this leads to area saving on the integrated circuit.

This is obtained in particular by using capacitors to isolate CMOS circuits and using switches to reset the common mode voltage at the half-dynamic level.

Of course, without prejudice to the principle of the present disclosure, the details of construction and the embodiments may vary widely with respect to what has been described and illustrated herein purely by way of example, without thereby departing from the scope of the present disclosure.

The solution here described can be applied when a ringing peak detector, able to work at high frequencies, in a voltage range outside standard CMOS operating area, is needed, for instance in BLDC motor drivers.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety, to the extent not inconsistent with the teachings and definitions of the present disclosure. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A ringing peak detector circuit, comprising:
an input buffer configured to receive a pair of differential feedback signals indicating a drain-source voltage of a low-side switch of a driver circuit including a full-bridge or half-bridge circuit for driving an inductive electrical load, the input buffer configured to generate shifted differential feedback signals having a common mode voltage that is equal to approximately one half of a supply voltage of the full-bridge or half-bridge circuit;
a peak detector circuit coupled to the input buffer to receive the shifted differential voltage signals, the peak detector circuit configured to detect a peak value of an oscillation on the inductive electric load and to generate an output signal indicating the detected peak value; and
a circuit configured to generate a control signal based on the detected peak value and a maximum value, the control signal being for use in controlling the low-side switch.

2. The ringing peak detector circuit of claim 1, wherein the input buffer comprises:
a pair of input nodes configured to receive the pair of differential feedback signals;
a polarity circuit including a pair of inputs and a pair of outputs, the polarity circuit configured to switch signals on the pair of inputs to select a polarity of signals on the pair of outputs; and
a pair of input capacitors coupled between the pair of input nodes and the pair of inputs of the polarity circuit.

3. The ringing peak detector circuit of claim 2, wherein the input buffer further comprises a shifting circuit including a pair of inputs coupled to the pair of outputs of the polarity circuit and including a pair of outputs, and further including a half-voltage input configured to receive a voltage equal to one half of the supply voltage, the shifting circuit configured to alternately couple the pair of outputs to the half-voltage input.

4. The ringing peak detector circuit of claim 3, wherein the peak detector circuit comprises:
a peak capacitor having a first node and a second node, the first node coupled to one of the pair of outputs of the shifting circuit;
a current source coupled to the second node of the peak capacitor and the current source including a control input;
a differential amplifier having a first input coupled to the other one of the pair of outputs of the shifting circuit, having an output coupled to the control input of the current source, and having a second input coupled to the second node of the peak capacitor.

5. The ringing peak detector circuit of claim 4, wherein the circuit configured to generate the control signal based on the detected peak value and the maximum value comprises a differential analog-to-digital converter having a first input coupled to the second node of the peak capacitor, a second input coupled to the other one of the pair of outputs of the shifting circuit, and an output that generates the control signal utilized in controlling the low-side switch.

6. The ringing peak detector circuit of claim 5 further comprising a subtraction circuit having first input coupled to the output of the differential analog-to-digital converter and a second input configured to receive a set point value, the subtraction circuit configured to subtract the set point value from the control signal to generate a ringing error signal for use in controlling the low-side switch.

7. The ringing peak detector circuit of claim 5 further comprising a set point circuit coupled to one of the pair of outputs of the polarity circuit.

8. The ringing peak detector circuit of claim 7, wherein the set point circuit comprises:
a set point storage capacitor having a first node coupled to the one of the pair of outputs of the polarity circuit and having a second node;
a first switching circuit having a first node configured to receive a set point voltage, a second node coupled to the second node of the set point storage capacitor, and a third node configured to receive a reference voltage, the first switching circuit configured to alternately apply the set point voltage and reference voltage to the second node of the set point storage capacitor.

9. The ringing peak detector circuit of claim 1, wherein the maximum value is a fixed value.

10. A system, comprising:
an inductive electrical load driver including a resonant full-bridge circuit or half-bridge circuit having at least one high side electronic switch and at least one low side electronic switch coupled in series between a supply voltage node and a reference voltage node, and having an output node configured to be coupled to an inductive electrical load; and a ringing peak detector circuit including:
an input buffer configured to receive a pair of differential feedback signals indicating a drain-source voltage of the at least one low side electronic switch, the input buffer configured to generate shifted differential feedback signals having a common mode voltage that is equal to approximately one half of the supply voltage;
a peak detector circuit coupled to the input buffer to receive the shifted differential voltage signals, the peak detector circuit configured to detect a peak value of an oscillation on the inductive electric load and to generate an output signal indicating the detected peak value; and
a circuit configured to generate a control signal based on the detected peak value and a maximum value, and apply the control signal to the inductive electrical load driver to control switching of the at least one low side switch.

11. The system of claim 10 further comprising a DC motor coupled to the inductive electrical load driver.

12. The system of claim 11, wherein the inductive electrical load driver is configured to generate pulse width modulation signals to control the DC motor.

13. The system of claim 10, wherein the high side and low side electronic switches comprise at least one of MOSFET or IGBT transistors.

14. The system of claim 10, wherein the input buffer comprises:
a shift module configured to connect the first and second differential feedback signals to a half voltage corresponding to the half-dynamic level of the supply voltage; and
a polarity module configured to switch the polarity of the first and second differential feedback signals.

15. The system of claim 14 further comprising a set point circuit coupled to the input buffer, the set point circuit configured to add a voltage corresponding to the maximum value to a differential output voltage of the first and second shifted differential voltage signals.

16. A method, comprising:
receiving first and second differential feedback voltage signals, wherein the first and second differential feedback signals indicate a drain-source voltage of a low-side switch contained in a bridge circuit driving an inductive electrical load;
coupling the first and second differential feedback voltage signals to first and second input nodes to provide first and second differential feedback voltage signals on the first and second input nodes;
shifting levels of the coupled first and second differential feedback voltage signals to provide a common mode of the first and second differential feedback voltage signals that is equal to approximately one half of a supply voltage, the shifted first and second differential feedback voltage signals being shifted first and second differential voltage signals;
detecting a peak value of a differential signal formed by the shifted first and second differential voltage signals; and
generating a peak ringing output signal based on the detected peak value of the differential signal formed by shifted first and second differential voltage signals and a maximum value.

17. The method of claim 16 further comprising generating a ringing error signal to control the bridge circuit driving the inductive electrical load, the ringing error signal being based upon a difference between the peak ringing output signal and the maximum value.

18. The method of claim 16, wherein coupling the first and second differential feedback voltage signals to the first and second input nodes comprises capacitively coupling the first and second differential feedback voltage signals to the first and second input nodes.

19. The method of claim 18, wherein shifting levels of the first and second differential voltage feedback signals comprises switching polarities of the coupled first and second differential feedback voltage signals.

20. The method of claim 16 further comprising generating pulse width modulated controls signals to control the bridge circuit.

21. A ringing peak detector circuit, comprising:
an input buffer configured to receive a differential pair of input signals, the input buffer being configured to generate a differential pair of shifted signals;
a peak detector circuit coupled to the input buffer to receive the differential pair of shifted voltage signals, the peak detector circuit being configured to detect a peak value of an output voltage Vpout corresponding to a peak value of a differential voltage of the differential pair of shifted signals and to generate an output signal indicating the detected peak value, wherein the input buffer comprises:
a pair of input nodes configured to receive the differential pair of input signals;
a pair of output nodes configured to provide the differential pair of shifted signals;
a pair of input capacitors each having first and second terminals, the first terminals being electrically coupled to the pair of input nodes and the second terminals being electrically coupled to the pair of output nodes; and
a shifting circuit including a shift voltage input configured to receive a shift voltage, the shifting circuit being configured to alternately electrically couple the shift voltage input to the pair of output nodes.

22. The ringing peak detector circuit of claim 21, wherein the pair of input capacitors includes first and second input capacitors, the pair of output nodes includes first and second output nodes, and the input buffer further comprises a polarity circuit configured to alternately electrically couple the first input capacitor to the first and second output nodes and alternately electrically couple the second input capacitor to the first and second output nodes.

23. The ringing peak detector circuit of claim 22 further comprising a set point circuit coupled to one of the pair of output nodes of the input buffer, wherein the set point circuit comprises:
a set point storage capacitor having a first node coupled to the one of the pair of output nodes of the input buffer and having a second node;
a switching circuit having a first node configured to receive a set point voltage, a second node coupled to the second node of the set point storage capacitor, and a third node configured to receive a reference voltage, the switching circuit being configured to alternately apply the set point voltage and reference voltage to the second node of the set point storage capacitor.

24. The ringing peak detector circuit of claim 21, wherein the peak detector circuit comprises:
a peak capacitor having a first node and a second node, the first node being coupled to a first output node of the pair of output nodes;

a current source coupled to the second node of the peak capacitor and the current source including a control input; and a differential amplifier having a first input coupled to a second output node of the pair of output nodes, having an output coupled to the control input of the current source, and having a second input coupled to the second node of the peak capacitor.

25. The ringing peak detector circuit of claim 24, further comprising a differential analog-to-digital converter having a first input coupled to the second node of the peak capacitor, a second input coupled to the second output node of the pair of output nodes, and an output that provides a digital control signal.

26. The ringing peak detector circuit of claim 25 further comprising a subtraction circuit having first input coupled to the output of the differential analog-to-digital converter and a second input configured to receive a set point value, the subtraction circuit being configured to subtract the set point value from the control signal to generate a ringing error signal.

* * * * *